(12) United States Patent
Chen

(10) Patent No.: US 9,257,899 B1
(45) Date of Patent: Feb. 9, 2016

(54) CHARGE PUMP CIRCUIT AND PHASE LOCK LOOP CIRCUIT HAVING THE SAME

(71) Applicant: ISSC TECHNOLOGIES CORP., Hsinchu (TW)

(72) Inventor: Yi-Lung Chen, Hsinchu (TW)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/490,853

(22) Filed: Sep. 19, 2014

(30) Foreign Application Priority Data

Jul. 18, 2014 (TW) .............................. 103124736 A

(51) Int. Cl.
| | |
|---|---|
| H02M 3/07 | (2006.01) |
| H02M 1/36 | (2007.01) |
| H03L 7/089 | (2006.01) |
| H03L 7/093 | (2006.01) |

(52) U.S. Cl.
CPC ........ *H02M 1/36* (2013.01); *H02M 3/07* (2013.01); *H03L 7/0891* (2013.01); *H03L 7/093* (2013.01)

(58) Field of Classification Search
CPC ......... H02M 1/36; H02M 3/07; H02M 3/073; G05F 3/205
USPC ........................... 327/148, 157, 535, 536, 537
See application file for complete search history.

(56) References Cited

U.S. PATENT DOCUMENTS

| | | | | |
|---|---|---|---|---|
| 2009/0243671 | A1* | 10/2009 | Draxelmayr | H03L 7/0896 327/157 |
| 2011/0199136 | A1* | 8/2011 | Tsai | H02M 3/07 327/157 |
| 2012/0139650 | A1* | 6/2012 | Tsai | H03D 13/00 331/1 R |
| 2013/0154696 | A1* | 6/2013 | Chen | H02M 3/07 327/157 |

\* cited by examiner

*Primary Examiner* — John Poos
(74) *Attorney, Agent, or Firm* — Slayden Grubert Beard PLLC

(57) ABSTRACT

A charge pump circuit and a phase lock loop circuit (PLL) having the same are provided. A main voltage divider and an assistant voltage divider configured in the charge pump circuit generate a voltage division within a predetermined time of activating the charge pump circuit. Therefore, when the charge pump circuit initiates operating, a voltage of a control end of a main switch set configured in the charge pump circuit is set to be the voltage division. The voltage of the control end is gradually decreased from the voltage division to a stable voltage according to a first current and a second current flowing through the main switch set. Accordingly, it can decrease the time from initiating operation of the pump circuit to stabilizing the voltage of the control end, thereby it can increase the working efficiency of the PLL.

18 Claims, 4 Drawing Sheets

CHARGE PUMP CIRCUIT AND PHASE LOCK LOOP CIRCUIT HAVING THE SAME

BACKGROUND

1. Technical Field

The present disclosure relates to a charge pump circuit and a phase lock loop circuit having the same, in particular to a charge pump circuit and a phase lock loop circuit having the same, capable of locking phase quickly.

2. Description of Related Art

A charge pump circuit is a kind of component widely applied to circuits, in particular applied to a phase lock loop circuit. Please refer to FIG. 1 which is a schematic view of a traditional charge pump circuit. As shown in FIG. 1, a traditional charge pump circuit 10 includes an up-side current source A1, a down-side current source A2, an up-side switch UP and a down-side switch DOWN. An end of the up-side current source A1 is electrically connected to a power voltage VDD. Another end of the up-side current source A1 is sequentially connected in series with the up-side switch UP, the down-side switch DOWN, and an end of the down-side current source A2, and another end of the down-side current source A2 is grounded. A control end CON is disposed between the up-side switch UP and the down-side switch DOWN. The traditional charge pump circuit 10 is formed according to the connection relationship between aforesaid components, and can adjust a voltage Va1 of the control end CON according to turning on/off of the up-side switch UP and the down-side switch DOWN to output the voltage Va1 of the control end CON.

The up-side switch UP is controlled by an up-side control signal CS1, and the down-side switch DOWN is controlled by a down-side control signal CS2. Therefore, in order to increase the voltage Va1 of the control end CON (i.e. the control end CON is charged), for example, the up-side control signal CS1 is high voltage level and the down-side control signal CS2 is low voltage level, at this time, the up-side switch UP is turned on and the down-side switch DOWN is turned off. The first current I1 of the current source A1 flows through the up-side switch UP to the control end CON to increase the voltage Va1 of the control end CON. In order to decrease the voltage Va1 of the control end CON (i.e. the control end CON is discharged), for example, the down-side control signal CS1 is low voltage level and the down-side control signal CS2 is high voltage level. At this time, the up-side switch UP is turned off and the down-side switch DOWN is turned on. The second current I2 of the current source flows through the down-side switch DOWN to ground to decrease the voltage Va1 of the control end CON. Accordingly, the charge pump circuit 10 can stabilize the voltage Va1 of the control end CON by the first current I1 and the second current I2.

As shown in FIG. 1, during the process from initiating operation of the charge pump circuit 10 to stabilizing the voltage Va1 of the control end CON, the voltage Va1 of the control end CON is gradually decreased from the power voltage VDD to a stable voltage. However, it usually takes a lot of time from the power voltage VDD to the stable voltage. If the time from initiating operation of the pump circuit 10 to stabilizing the voltage Va1 of the control end CON could be shortened, a working efficiency of the PLL can be efficiently increased.

SUMMARY

An exemplary embodiment of the present disclosure provides a charge pump circuit. The charge pump circuit includes an up-side current source, a down-side current source, a main switch set, an assistant switch set, a main voltage divider and an assistant voltage divider. The up-side current source is configured for providing a first current. The down-side current source is configured for providing a second current. An end of the main switch set is connected with the up-side current source serially, and another end is connected with the down-side current source serially. The main switch set has a control end. The main switch set controls the first current to flow from the up-side current source to the control end according to a rising signal, controls the second current to flow from the control end to the down-side current source according to a falling signal, and outputs a voltage of the control end. An end of the assistant switch set is electrically connected to the end of the main switch set, and another end of the assistant switch set is electrically connected to another end of the main switch set. The assistant switch set has an assistant end. The assistant switch set controls the first current to flow from the up-side current source to the assistant end according to the inversely rising signal, and controls the second current to flow from the assistant end to the down-side current source according to the inversely falling signal. The main voltage divider is coupled to the main switch set, to generate a voltage division to the control end when the charge pump circuit is activated. The main voltage divider is stopped from generating the voltage division to the control end after a predetermined time of activating the charge pump circuit. The assistant voltage divider is coupled to the assistant switch set and generates the voltage division to the assistant end.

According to one exemplary embodiment of the present disclosure, a phase lock loop circuit includes a charge pump circuit, a phase and a frequency detector, a loop filter, a voltage-controlled oscillator and a frequency divider. The charge pump circuit includes an up-side current source, a down-side current source, a main switch set, an assistant switch set, a main voltage divider and an assistant voltage divider. The up-side current source is configured for providing a first current. The down-side current source is configured for providing a second current. An end of the main switch set is connected with the up-side current source serially, and another end is connected with the down-side current source serially. The main switch set has a control end. The main switch set controls the first current to flow from the up-side current source to the control end according to a rising signal, controls the second current to flow from the control end to the down-side current source according to a falling signal, and outputs a voltage of the control end. An end of the assistant switch set is electrically connected to the end of the main switch set, and another end is electrically connected to another end of the main switch set. The assistant switch set has an assistant end. The assistant switch set controls the first current to flow from the up-side current source to the assistant end according to the inversely rising signal, and controls the second current to flow from the assistant end to the down-side current source according to the inversely falling signal. The main voltage divider is coupled to the main switch set, to generate a voltage division to the control end when the charge pump circuit is activated. The main voltage divider is stopped from generating the voltage division to the control end after a predetermined time of activating the charge pump circuit. The assistant voltage divider is coupled to the assistant switch set and generates the voltage division to the assistant end. The phase frequency detector is coupled to the charge pump circuit and configured for receiving a reference frequency signal and a frequency dividing signal and accordingly controlling the first current and the second current to flow to the control end and the assistant end. The loop filter is coupled to the charge pump circuit and configured for receiving the voltage of the control end and filtering and converting the voltage of the control end into a control voltage. The voltage-controlled oscillator is coupled to the loop filter and configured for receiving the control voltage to accordingly generate an output signal. The frequency of the output signal is controlled by the control voltage. The frequency divider is coupled between the voltage-controlled oscillator and the phase frequency detector, and configured for receiving the output signal and dividing the frequency of the output signal to generate the frequency dividing signal.

In summary, the charge pump circuit and the phase lock loop circuit (PLL) having the same provided by the embodiment of the present disclosure utilizes the main voltage divider and the assistant voltage divider to generate the voltage division within a predetermined time of activating the charge pump circuit, so the voltage of the control end of the main switch set is the voltage division when the charge pump circuit initiates operation. Next, the voltage of the control end is gradually decreased from the voltage division to a stable voltage according to a first current and a second current. Accordingly, it can decrease the time from initiating operation of the pump circuit to stabilizing the voltage of the control end, thereby it can increase the working efficiency of the PLL.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
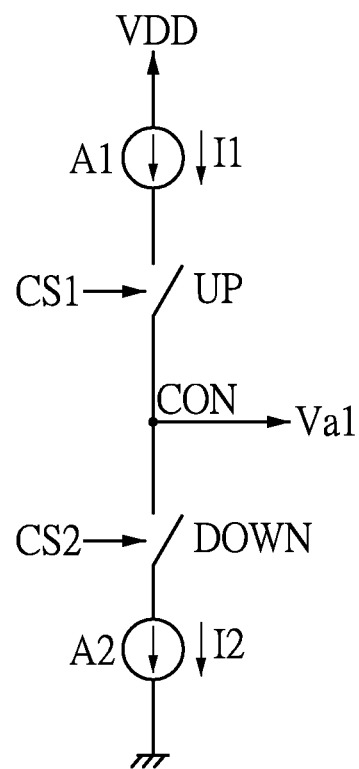
FIG. 1 is a schematic view of a traditional charge pump circuit.

Reference will now be made in detail to the exemplary embodiments of the present disclosure, examples of which are illustrated in the accompanying drawings. Wherever possible, the same reference numbers are used in the drawings and the description to refer to the same or like parts.

Figure 2:
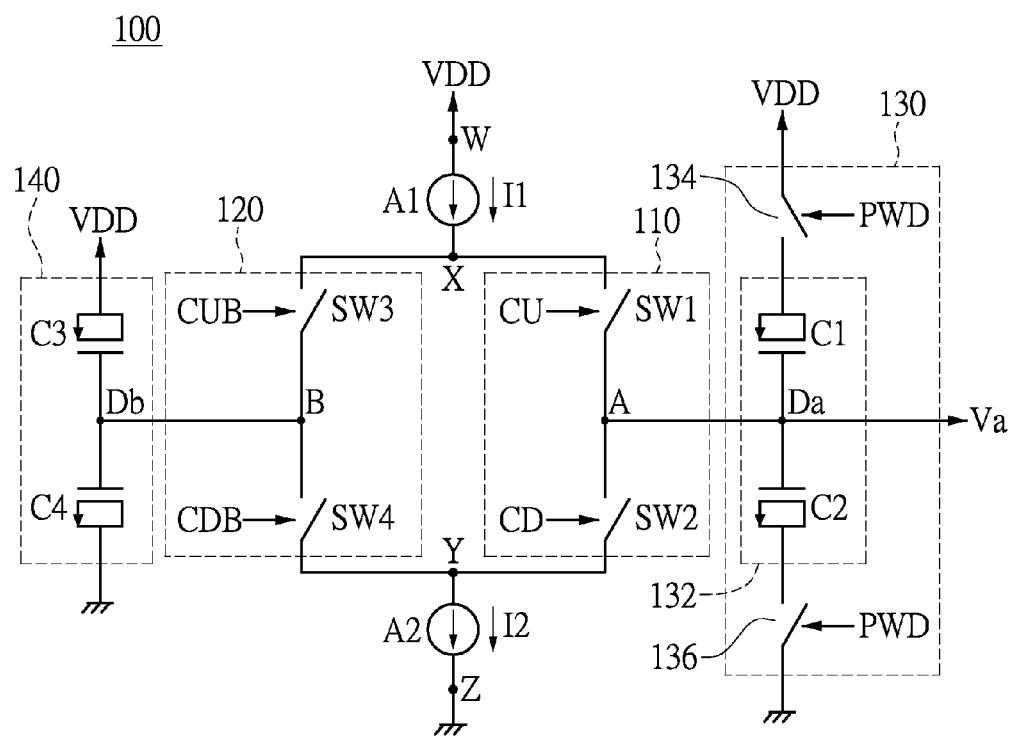
FIG. 2 is a schematic view of a charge pump circuit of an embodiment of the present disclosure.

Firstly, please refer to FIG. 2 which is a schematic view of a charge pump circuit of an embodiment of the present disclosure. As shown in FIG. 2, a charge pump circuit 100 includes an up-side current source A1, a down-side current source A2, a main switch set 110, an assistant switch set 120, a main voltage divider 130, and an assistant voltage divider 140. The up-side current source A1 is configured for providing a first current I1 to the main switch set 110 and the assistant switch set 120. An end W of the up-side current source A1 receives a power voltage VDD, and another end X of the up-side current source A1 is electrically connected to an end of the main switch set 110 and an end of the assistant switch set 120. The down-side current source A2 is configured for providing a second current I2, to acquire the current flowing through the main switch set 110 and the assistant switch set 120. An end Y of the down-side current source A2 is electrically connected to another end of the main switch set 110 and another end of the assistant switch set 120, and another end Z of the down-side current source A2 is grounded. The end Z can also be electrically connected to negative power voltage VDD, or a voltage value lower than the power voltage VDD, whereby a voltage difference can be formed between the end W and the end Z, but the present disclosure is not limited thereto.

The main switch set 110 has a control end A. The main switch set 110 controls the first current I1 to flow from the up-side current source A1 to the control end A according to a rising signal CU, controls the second current I2 to flow from the control end A to the down-side current source A2 according to a falling signal CD, and outputs a voltage Va of the control end A. More specifically, the main switch set 110 has a first switch SW1 and a second switch SW2. The first switch SW1 is coupled to the second switch SW2, and the control end A is disposed between the first switch SW1 and the second switch SW2. The first switch SW1 controls the first current I1 to flow from the up-side current source A1 to the control end A according to the rising signal CU, to increase the voltage Va of the control end A. The second switch SW2 controls the second current I2 to flow from the control end A to the down-side current source A2 according to the falling signal CD, to decrease the voltage Va of the control end A.

In this exemplary embodiment, when the control end A is charged, the first switch SW1 receives the rising signal CU with high voltage level and the second switch SW2 receives the falling signal CD with low voltage level, so the first switch SW1 is turned on and the second switch SW2 is turned off. At this time, the first switch SW1 conducts the current path of the first current I1 flowing from the up-side current source A1 to the control end A. The second switch SW2 cuts off the current path of the second current I2 flowing from the control end A to the down-side current source A2. When the control end A is discharged, the first switch SW1 receives the rising signal CU with low voltage level and the second switch SW2 receives the falling signal CD with high voltage level, so the first switch SW1 is turned off and the second switch SW2 is turned on. At this time, the first switch SW1 cuts off the current path of the first current I1 flowing from the up-side current source A1 to the control end A. The second switch SW2 conducts the current path of the second current I2 flowing from the control end A to the down-side current source A2. Accordingly, the voltage Va of the control end A can be controlled by the rising signal CU and the falling signal CD to be stable gradually by charging and discharging the control end A repeatedly.

The assistant switch set 120 has an assistant end B. The assistant switch set 120 controls the first current I1 to flow from the up-side current source A1 to the assistant end B according to the inversely rising signal CUB, and controls the second current I2 to flow from the assistant end B to the down-side current source A2 according to the inversely falling signal CDB. More specifically, the assistant switch set 120 has a third switch SW3 and a fourth switch SW4. The third switch SW3 is coupled to the fourth switch SW4, and the assistant end B is disposed between the third switch SW3 and the fourth switch SW4. The third switch SW3 controls the first current I1 to flow from the up-side current source A1 to the assistant end B according to the inversely rising signal CUB, to increase the voltage of the assistant end B. The fourth switch SW4 controls the second current I2 to flow from the assistant end B to the down-side current source A2 according to the inversely falling signal CDB, to decrease the voltage of the assistant end B.

Therefore, in this exemplary embodiment, when the control end A is charged, the third switch SW3 receives the inversely rising signal CUB (i.e. the rising signal CU with low voltage level), and the fourth switch SW4 receives the inversely falling signal CDB (i.e. the falling signal CD with high voltage level), so the third switch SW3 is turned off and the fourth switch SW4 is turned on. At this time, the third switch SW3 cuts off the current path of the first current I1 flowing from the up-side current source A1 to the assistant end B. The fourth switch SW4 conducts the current path of the second current I2 flowing from the assistant end B to the down-side current source A2. When the control end A is discharged, the third switch SW3 receives the inversely rising signal CUB (i.e. the rising signal CU with high voltage level), and the fourth switch SW4 receives the inversely falling signal CDB (i.e. The falling signal CD with low voltage level), so the third switch SW3 is turned on and the fourth switch SW4 is turned off. At this time, the third switch SW3 conducts the current path of the first current I1 flowing from the up-side current source A1 to the assistant end B. The fourth switch SW4 cuts off the current path of the second current I2 flowing from the assistant end B to the down-side current source A2. Accordingly, the voltage of the control end B can be controlled by the inversely rising signal CU and the inversely falling signal CD to be stable gradually.

It is noted that the main voltage divider 130 is coupled to the main switch set 110 to set an initial voltage (i.e. a voltage of the control end A at starting) of the control end A when the charge pump circuit 100 is initiated to operate. In the practical design, the main voltage divider 130 is configured for generating a voltage division to the control end A when the charge pump circuit 100 is activated, and then stopping generating the voltage division to the control end A after a predetermined time of activating the charge pump circuit 100. More specifically, the main voltage divider 130 includes a voltage division component 132, a switch 134 and a switch 136. The voltage division component 132 is connected in series with the switch 134 and 136. In this exemplary embodiment, an end of the switch 134 receives the power voltage VDD, and another end of the switch 134 is connected in series with an end of the voltage division component 132. Another end of the voltage division component 132 is connected in series with an end of the switch 136, and another end of the switch 136 is grounded. Accordingly, a structure of the main voltage divider 130 is formed.

The voltage division component 132 has a voltage division end Da electrically connected to the control end A. The two switches are turned on or turned off according to an initial signal PWD, to generate or stop generating the voltage division at the voltage division end Da. Therefore, when the charge pump circuit 100 is activated and the switches 134 and 136 receive the initial signal PWD indicating the switch 134 and 136 being turned on (such as the initial signal PWD with high voltage level), the switches 134 and 136 are turned on to generate the voltage division to the control end A, so the voltage Va of the control end A is set to be the aforesaid voltage division. After a predetermined time of activating the charge pump circuit 100, when the switches 134 and 136 receive the initial signal PWD indicating the switches 134 and 136 being turned off (such as the initial signal PWD with low voltage level), the switches 134 and 136 are turned off to stop generating the voltage division to the control end A, so the voltage of the control end A is adjusted according to the present control. In this exemplary embodiment, the switches 134 and 136 may be N type transistor switches, P type transistor switches, diode switches or other kind switches, but the present disclosure is not limited thereto.

In this exemplary embodiment, the voltage division component 132 includes a first capacitor C1 and a second capacitor C2. An end of the first capacitor C1 receives the power voltage VDD via the switch 134, another end of the first capacitor C1 is electrically connected to an end of the second capacitor C2, and another end of the second capacitor C2 is grounded via the switch 136. The voltage division end Da is disposed between the first capacitor C1 and the second capacitor C2. Accordingly, the voltage division component 132 can generate the voltage division at the voltage division end Da of the voltage division component 132 to the control end A, according to the capacitance values of the first capacitor C1 and the second capacitor C2. The first capacitor C1 and the second capacitor C2 of this embodiment has the same capacitance value, so the voltage division generated at the voltage division end Da is VDD/2. The voltage division generated at the voltage division end Da can also be designed according to practical conditions, and the present disclosure is not limited thereto.

In addition, the first capacitor C1 and the second capacitor C2 of this embodiment can be made by other kinds of electric device. Preferably, the first capacitor C1 can be a P type transistor. The second capacitor C2 can be an N type transistor. A source and a drain of the P type transistor receive the power voltage VDD via the switch 134. A gate of the P type transistor is electrically connected to a gate of the N type transistor. A source and a drain of the N type transistor are grounded via the switch 136. The present disclosure is also not limited thereto.

It is noted that the assistant voltage divider 140 is coupled to the assistant switch set 120 to generate the voltage division to the assistant end B, whereby the voltage of the assistant end B can be maintained. In this exemplary embodiment, the assistant voltage divider 140 has an assistant voltage division end Db. The assistant voltage division end Db is electrically connected to the assistant end B, and the voltage division is generated at the assistant voltage division end Db to the assistant end B. An end of the assistant voltage division end Db receives the power voltage VDD, and another end of the assistant voltage division end Db is grounded.

In this exemplary embodiment, the assistant voltage divider 140 includes a third capacitor C3 and a fourth capacitor C4. An end of the third capacitor C3 receives the power voltage VDD. Another end of the third capacitor C3 is electrically connected to an end of the fourth capacitor C4. Another end of the fourth capacitor C4 is grounded. The assistant voltage division end Db is disposed between the third capacitor C3 and the fourth capacitor C4. Accordingly, the assistant voltage divider 140 can generate the voltage division at the assistant voltage division end Db to the assistant end B, according to the capacitance values of the third capacitor C3 and the fourth capacitor C4. The third capacitor C3 and the fourth capacitor C4 of this embodiment have the same capacitance value, so the voltage division generated at the assistant voltage division end Db is VDD/2. The voltage division generated at the assistant voltage division end Db can also be designed according to practical conditions, and the present disclosure is not limited thereto.

In addition, the third capacitor C3 and the fourth capacitor C4 of this embodiment can be made by other kinds of electric device, such as the first capacitor C1 and the second capacitor C2. Preferably, the third capacitor C3 can be a P type transistor. The fourth capacitor C4 can be an N type transistor. A source and a drain of the P type transistor receive the power voltage VDD. A gate of the P type transistor is electrically connected to a gate of the N type transistor. And a source and a drain of the N type transistor are grounded. The present disclosure is also not limited thereto.

It should be noted that the voltage division generated by the voltage division component 132 (such as the voltage division generated at the voltage division end Da in this embodiment) must be the same as the voltage division generated by the assistant voltage divider 140 (such as the voltage division generated at the assistant voltage division end Db). So the issue that the voltage of the control end A of the main switch set 110 cannot be decreased gradually to the stable voltage due to the difference of the voltage divisions generated at the voltage division end Da and the assistant voltage division end Db will not happen. Accordingly, the first capacitor C1, the second capacitor C2, the third capacitor C3 and the fourth capacitor C4 of this embodiment are transistors having the same size and made by the same manufacturing process, so the voltage divisions generated by the voltage division component 132 and the assistant voltage divider 140 can be more consistent.

Please refer to FIG. 2, for explanatory convenience, the voltage divisions generated at the voltage division end Da and the assistant voltage division end Db are VDD/2 in the following illustration. Therefore, when the charge pump circuit 100 is activated, the control end A of the main switch set 110 is set to be the voltage division of the voltage division end Da, i.e. VDD/2. Next, the charge pump circuit 100 controls the first switch SW1, the second switch SW2, the third switch SW3 and fourth switch SW4 respectively according to the rising signal CU, the falling signal CD, the inversely rising signal CUB and the inversely falling signal CDB.

During the process of stabilizing the voltage of the control end A, when the charge pump circuit 100 wants to increase the voltage Va of the control end A, the first switch SW1 and the fourth switch SW4 are turned on, and the second switch SW2 and the third switch S3 are turned off correspondingly. At this time, the voltage Va of the control end A is increased by the first current I1. The voltage of the assistant end B is maintained by the assistant voltage divider 140. When the charge pump circuit 100 wants to decrease the voltage Va of the control end A, the first switch SW1 and the fourth switch SW4 are turned off, and the second switch SW2 and the third switch SW3 are turned on. At this time, the voltage Va of the control end A is decreased by the second current I2. The voltage of the assistant end B is also maintained by the assistant voltage divider 140. Therefore, the voltage of the control end A can be decreased from the VDD/2 to the stable voltage according to the turning on and turning off of the four switches.

Figure 3:
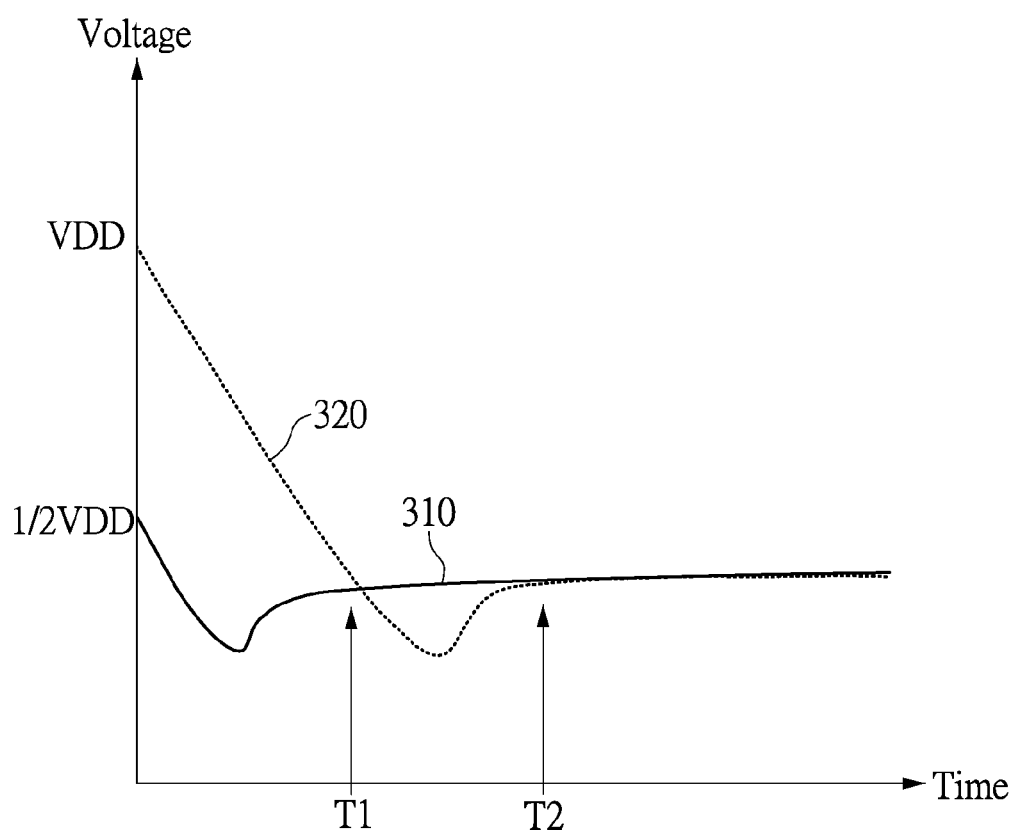
FIG. 3 is a relationship diagram between voltage and time at a control end of the embodiment of the present disclosure.

Please refer to FIG. 1, FIG. 2 and FIG. 3. FIG. 3 is a relationship diagram between voltage and time at the control end of the embodiment of the present disclosure. As shown in FIG. 3, a waveform 310 shows the variation of voltage and time at the control end A of the charge pump circuit 100 of the present disclosure. A waveform 320 shows the variation of voltage and time at a control end CON of the traditional charge pump circuit 10. In this exemplary embodiment, the initial voltage of the control end A (i.e. the voltage of the control end A at starting) is a half of the power voltage VDD, and the voltage Va of the control end A is stabilized at time point T1. The initial voltage of the control end CON (i.e. the voltage of the control end CON at starting) is the power voltage VDD, and the voltage of the control end CON is stabilized at time point T2.

In conclusion, during the process from initiating operation of the traditional charge pump circuit 10 to stabilizing the voltage of the control end CON, the voltage of the control end CON is decreased gradually from the power voltage VDD to the stable voltage. In the present disclosure, during the process from initiating operation of the charge pump circuit 100 to stabilizing the voltage Va of the control end A, the voltage Va of the control end A is decreased gradually from a half of the power voltage VDD to the stable voltage. Therefore, compared with the traditional charge pump circuit 10, the charge pump circuit 100 of the present disclosure can stabilize the voltage of the control end more quickly. Accordingly, the charge pump circuit 100 of the present disclosure can decrease the time from initiating operation of the charge pump circuit 100 to stabilizing the voltage of the control end CON, thereby the working efficiency of the charge pump circuit 100 can be increased.

Figure 4:
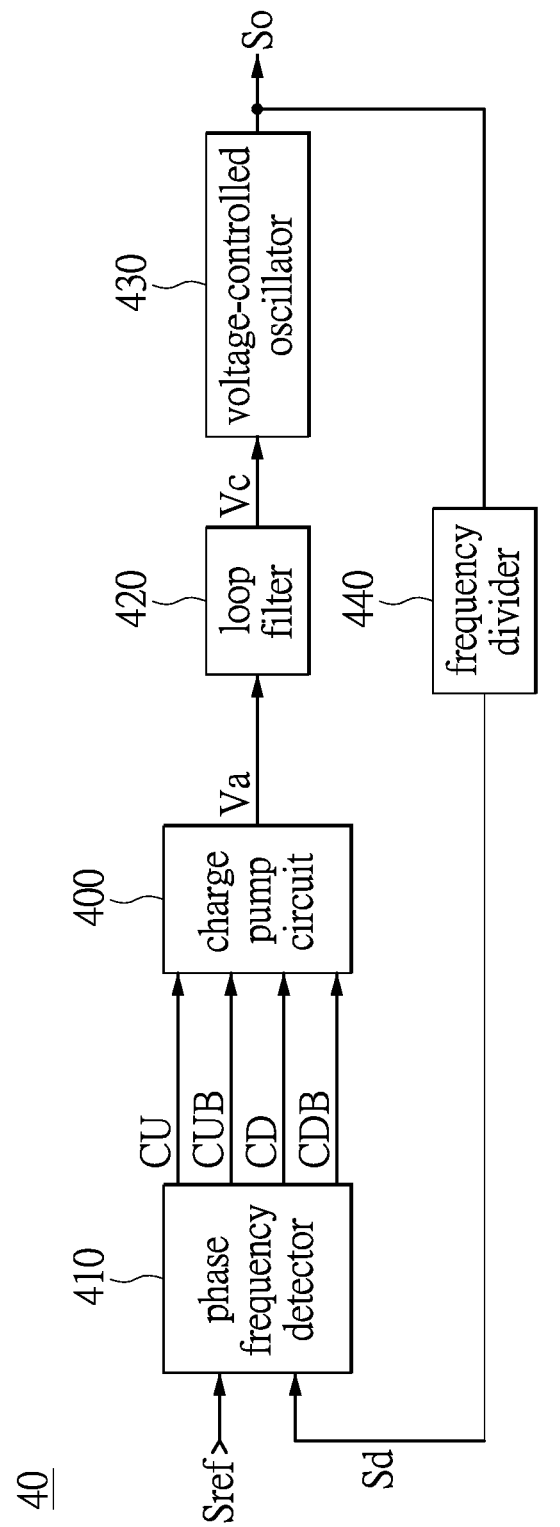
FIG. 4 is a schematic view of a phase lock loop circuit of the embodiment of the present disclosure.

Next, please refer to FIG. 4. FIG. 4 is a schematic view of a phase lock loop circuit of an embodiment of the present disclosure. As shown in FIG. 4, the phase lock loop circuit 40 includes a charge pump circuit 400, a phase frequency detector 410, a loop filter 420, a voltage-controlled oscillator 430 and a frequency divider 440. With respect to the internal components and operations of the charge pump circuit 400, they are the same as that of the charge pump circuit 100, so detailed description is omitted.

The phase frequency detector 410 is coupled to the charge pump circuit 400 and configured for receiving a reference frequency signal Sref and a frequency dividing signal Sd, to accordingly control the first current (such as the first current I1) and the second current (such as second current I2) of the charge pump circuit 400 to the control end (such as control end A) and the assistant end (such as assistant end B). In this exemplary embodiment, the phase frequency detector 410 outputs the rising signal CU, the inversely rising signal CUB, the falling signal CD and the inversely falling signal CDB to the charge pump circuit 400 according to a comparison result of phases and frequencies of the reference frequency signal Sref and the frequency dividing signal Sd. The reference frequency signal Sref of this embodiment can be set according to a specific frequency and phase, but the present disclosure is not limited thereto.

Next, the charge pump circuit 400 further outputs the voltage Va of the control end A to the loop filter 420 according to the rising signal CU, the inversely rising signal CUB, the falling signal CD and the inversely falling signal CDB. The loop filter 420 is coupled to the charge pump circuit 400 and configured for receiving the voltage Va of the control end A, and then filtering and converting the voltage Va into a control voltage Vc. The voltage-controlled oscillator 430 is coupled to the loop filter 420 and configured for receiving the control voltage Vc to accordingly generate an output signal So. The frequency of the output signal So is controlled by the control voltage Vc, which means that the frequency of the output signal So may be adjusted according to the control voltage Vc.

The frequency divider 440 is coupled between the voltage-controlled oscillator 430 and the phase frequency detector 410. The frequency divider 440 receives the output signal So and divides the frequency of the output signal So to generate a frequency dividing signal Sd. Accordingly, the phase lock loop circuit 40 locks the output signal So to a specific frequency and phase gradually according to the reference frequency signal Sref. The phase frequency detector 410, the loop filter 420, the voltage-controlled oscillator 430 and the frequency divider 440 are well known components used in a general phase lock loop circuit, and persons of ordinary skill in this technology field should realize the inner structures and individual operation of the phase frequency detector 410, the loop filter 420, the voltage-controlled oscillator 430 and the frequency divider 440, so detailed description is omitted.

Whole operation of the phase lock loop circuit 40 is described in the following example. For explanatory convenience, the voltage divisions generated at the voltage division end and the assistant voltage division end (such as the voltage division end Da and the assistant voltage division end Db shown in FIG. 2) of the charge pump circuit 400 are VDD/2 in the following illustration. Therefore, when the phase lock loop circuit 40 is activated, the control end of the charge pump circuit 400 is set to be the voltage division of the voltage division end, i.e. VDD/2.

At this time, the phase frequency detector 410 compares the frequencies of the reference frequency signal Sref and the frequency dividing signal Sd at starting. If the frequency of the frequency dividing signal Sd is higher than that of the reference frequency signal Sref, the phase frequency detector 410 outputs the rising signal CU with low voltage level and the falling signal CD with high voltage level. At this time, the charge pump circuit 400 decreases the voltage Va of the control end A according to the rising signal CU, the inversely rising signal CUB, the falling signal CD and the inversely falling signal CDB. At this time, the voltage of the control end A starts to decrease from VDD/2. Next, the loop filter 420 receives the decreasing voltage Va (i.e. being lower than VDD/2) and then decreases the frequency dividing signal Sd by the operations of the voltage-controlled oscillator 430 and the frequency divider 440.

Next, if the frequency of the frequency dividing signal Sd is lower than that of the reference frequency signal Sref, the phase frequency detector 410 outputs the rising signal CU with high voltage level and the falling signal CD with low voltage level. At this time, the charge pump circuit 400 increases the voltage Va of the control end A according to the rising signal CU, the inversely rising signal CUB, the falling signal CD and the inversely falling signal CDB. Next, the loop filter 420 receives the increasing voltage Va and then increases the frequency dividing signal Sd by the operations of the voltage-controlled oscillator 430 and the frequency divider 440. When the frequency of the frequency dividing signal Sd is equal to that of the reference frequency signal Sref, the phase frequency detector 410 outputs both the rising signal CU and the falling signal CD with low voltage level, which indicates that the output signal So is locked to the specific frequency and phase.

Accordingly, during the process from initiating operation of the charge pump circuit of the present disclosure to stabilizing the voltage of the control end, the voltage of the control end is decreased gradually from a half of the power voltage VDD to the stable voltage. Therefore, the charge pump circuit 400 of the present disclosure can decrease the time from initiating operation of the charge pump circuit 100 to stabilizing the voltage of the control end CON, thereby the phase lock loop circuit 400 of the present disclosure can lock the specific frequency and phase more quickly.

In summary, the charge pump circuit and the phase lock loop circuit (PLL) having the same provided by the embodiment of the present disclosure utilizes the main voltage divider and the assistant voltage divider to generate the voltage division within a predetermined time of activating the charge pump circuit, so the voltage of the control end of the main switch set is the voltage division when the charge pump circuit initiates operating. Next, the voltage of the control end is gradually decreased from the voltage division to the stable voltage according to a first current and a second current. Accordingly, it can decrease the time from initiating operation of the pump circuit to stabilizing the voltage of the control end, thereby it can increase the working efficiency of the PLL.

The above-mentioned descriptions represent merely the exemplary embodiment of the present disclosure, without any intention to limit the scope of the present disclosure thereto. Various equivalent changes, alterations or modifications based on the claims of the present disclosure are all consequently viewed as being embraced by the scope of the present disclosure.

What is claimed is:

1. A charge pump circuit, comprising:
   an up-side current source, configured for providing a first current;
   a down-side current source, configured for providing a second current;
   a main switch set, an end of the main switch set connected with the up-side current source serially and another end of the main switch set connected with the down-side current source serially, the main switch set having a control end, the main switch set configured for controlling the first current to flow from the up-side current source to the control end according to a rising signal, controlling the second current to flow from the control end to the down-side current source according to a falling signal, and outputting a voltage of the control end;
   an assist switch set, an end of the assistant switch set electrically connected with the end of the main switch set and another end of the assistant switch set electrically connected with the another end of the main switch set, the assistant switch set having an assistant end, the assistant switch set configured for controlling the first current to flow from the up-side current source to the assistant end according to the inversely rising signal, and controlling the second current to flow from the assistant end to the down-side current source according to the inversely falling signal;
   a main voltage divider, coupled to the main switch set and configured for generating a voltage division to the control end when the charge pump circuit is activated, and stopping generating the voltage division to the control end after a predetermined time of activating the charge pump circuit; and
   an assistant voltage divider, coupled to the assistant switch set and generating the voltage division to the assistant end.

2. The charge pump circuit according to claim 1, wherein the main switch set has a first switch and a second switch, the first switch is coupled to the second switch, and the control end is disposed between the first switch and the second switch, the first switch controls the first current to flow from the up-side current source to the control end according to the rising signal, and the second switch controls the second current to flow from the control end to the down-side current source according to the falling signal.

3. The charge pump circuit according to claim 2, wherein the assistant switch set has a third switch and a fourth switch, the third switch is coupled to the fourth switch, and the assistant end is disposed between the third switch and the fourth switch, the third switch controls the first current to flow from the up-side current source to the assistant end according to the inversely rising signal and the fourth switch controls the second current to flow from the assistant end to the down-side current source according to the inversely falling signal.

4. The charge pump circuit according to claim 1, wherein the main voltage divider comprises:
- two switches; and
- a voltage division component, serially connected between the two switches and having a voltage division end electrically connected to the control end;
- wherein, the two switches are turned on or turned off according to an initial signal, to generate or stop generating the voltage division at the voltage division end.

5. The charge pump circuit according to claim 1, wherein the assistant voltage divider has an assistant voltage division end electrically connected to the assistant end, and generates the voltage division at the assistant voltage division end.

6. The charge pump circuit according to claim 4, wherein the voltage division component comprises:
- a first capacitor, an end of the first capacitor configured for receiving a power voltage via the switch; and
- a second capacitor, an end of the second capacitor electrically connected to another end of the first capacitor, another end of the second capacitor being grounded via the other switch, and the voltage division end disposed between the first capacitor and the second capacitor.

7. The charge pump circuit according to claim 6, wherein the first capacitor is a P type transistor, the second capacitor is an N type transistor, a source and a drain of the P type transistor receive the power voltage via one of the switches, a gate of the P type transistor is electrically connected to a gate of the N type transistor, and a source and a drain of the N type transistor are grounded via the another of the switches.

8. The charge pump circuit according to claim 5, wherein the assistant voltage divider comprises:
- a third capacitor, an end of the third capacitor configured for receiving a power voltage; and
- a fourth capacitor, an end of the fourth capacitor electrically connected to another end of the third capacitor, another end of the fourth capacitor being grounded, and the assistant voltage division end disposed between the third capacitor and the fourth capacitor.

9. The charge pump circuit according to claim 8, wherein the third capacitor is a P type transistor, the fourth capacitor is an N type transistor, a source and a drain of the P type transistor receive the power voltage, a gate of the P type transistor is electrically connected to a gate of the N type transistor, and a source and a drain of the N type transistor are grounded.

10. A phase lock loop circuit, comprising:
- a charge pump circuit, comprising:
  - an up-side current source, configured for providing a first current;
  - a down-side current source, configured for providing a second current;
  - a main switch set, an end of the main switch set connected with the up-side current source serially and another end of the main switch set connected with the down-side current source serially, the main switch set having a control end, the main switch set controlling the first current to flow from the up-side current source to the control end according to a rising signal, controlling the second current to flow from the control end to the down-side current source according to a falling signal, and outputting a voltage of the control end;
  - an assist switch set, an end of the assistant switch set electrically connected with the end of the main switch set and another end of the assistant switch set electrically connected with the another end of the main switch set, the assistant switch set having an assistant end, the assistant switch set controlling the first current to flow from the up-side current source to the assistant end according to the inversely rising signal, and controlling the second current to flow from the assistant end to the down-side current source according to the inversely falling signal;
  - a main voltage divider, coupled to the main switch set and configured for generating a voltage division to the control end when the charge pump circuit is activated, and stopping generating the voltage division to the control end after a predetermined time of activating the charge pump circuit; and
  - an assistant voltage divider, coupled to the assistant switch set and configured for generating the voltage division to the assistant end;
- a phase frequency detector, coupled to the charge pump circuit and configured for receiving a reference frequency signal and a frequency dividing signal and accordingly controlling the first current and the second current to flow to the control end and the assistant end;
- a loop filter, coupled to the charge pump circuit and configured for receiving a voltage of the control end to filter and convert the voltage of the control end into a control voltage;
- a voltage-controlled oscillator, coupled to the loop filter and configured for receiving the control voltage to accordingly generate an output signal, wherein the frequency of the output signal is controlled by the control voltage; and
- a frequency divider, coupled between the voltage-controlled oscillator and the phase frequency detector, and configured for receiving the output signal and dividing the frequency of the output signal to generate the frequency dividing signal.

11. The phase lock loop circuit according to claim 10, wherein the main switch set has a first switch and a second switch, the first switch is coupled to the second switch, and the control end is disposed between the first switch and the second switch, the first switch controls the first current to flow from the up-side current source to the control end according to the rising signal, and the second switch controls the second current to flow from the control end to the down-side current source according to the falling signal.

12. The phase lock loop circuit according to claim 11, wherein the assistant switch set has a third switch and a fourth switch, the third switch is coupled to the fourth switch, and the assistant end is disposed between the third switch and the fourth switch, the third switch controls the first current to flow from the up-side current source to the assistant end according to the inversely rising signal and the fourth switch controls the second current to flow from the assistant end to the down-side current source according to the inversely falling signal.

13. The phase lock loop circuit according to claim 10, wherein the main voltage divider comprises:
- two switches; and
- a voltage division component, serially connected between the two switches and having a voltage division end electrically connected to the control end;
- wherein, the two switches are turned on or turned off according to an initial signal, to generate or stop generating the voltage division at the voltage division end.

14. The phase lock loop circuit according to claim 10, wherein the assistant voltage divider has an assistant voltage division end electrically connected to the assistant end, and generates the voltage division at the assistant voltage division end.

15. The phase lock loop circuit according to claim 13, wherein the voltage division component comprises:
   a first capacitor, an end of the first capacitor configured for receiving a power voltage via the switch; and
   a second capacitor, an end of the second capacitor electrically connected to another end of the first capacitor, another end of the second capacitor being grounded via the other switch, and the voltage division end disposed between the first capacitor and the second capacitor.

16. The phase lock loop circuit according to claim 15, wherein the first capacitor is a P type transistor, the second capacitor is an N type transistor, a source and a drain of the P type transistor receives the power voltage via one of the switches, a gate of the P type transistor is electrically connected to a gate of the N type transistor, and a source and a drain of the N type transistor are grounded via the another of the switches.

17. The phase lock loop circuit according to claim 14, wherein the assistant voltage divider comprises:
   a third capacitor, an end of the third capacitor configured for receiving a power voltage; and
   a fourth capacitor, an end of the fourth capacitor electrically connected to another end of the third capacitor, another end of the fourth capacitor being grounded, and the assistant voltage division end disposed between the third capacitor and the fourth capacitor.

18. The phase lock loop circuit according to claim 17, wherein the third capacitor is a P type transistor, the fourth capacitor is an N type transistor, a source and a drain of the P type transistor receive the power voltage, a gate of the P type transistor is electrically connected to a gate of the N type transistor, and a source and a drain of the N type transistor are grounded.

* * * * *